United States Patent
Ohura et al.

(10) Patent No.: US 9,847,257 B2
(45) Date of Patent: Dec. 19, 2017

(54) LASER PROCESSING METHOD

(71) Applicant: DISCO CORPORATION, Tokyo (JP)

(72) Inventors: Yukinobu Ohura, Tokyo (JP); Senichi Ryo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/218,712

(22) Filed: Jul. 25, 2016

(65) Prior Publication Data

US 2017/0033007 A1   Feb. 2, 2017

(30) Foreign Application Priority Data

Jul. 29, 2015 (JP) ................. 2015-150049

(51) Int. Cl.
| | |
|---|---|
| H01L 21/00 | (2006.01) |
| H01L 21/78 | (2006.01) |
| H01L 21/268 | (2006.01) |
| H01L 21/68 | (2006.01) |
| H01L 21/67 | (2006.01) |
| H01L 21/683 | (2006.01) |
| H01L 21/687 | (2006.01) |

(52) U.S. Cl.
CPC ............ *H01L 21/78* (2013.01); *H01L 21/268* (2013.01); *H01L 21/6715* (2013.01); *H01L 21/67115* (2013.01); *H01L 21/68* (2013.01); *H01L 21/6838* (2013.01); *H01L 21/68764* (2013.01)

(58) Field of Classification Search
CPC ....... H01L 21/78; H01L 21/268; H01L 21/68; H01L 21/6715; H01L 21/67115; H01L 21/6838; H01L 21/68764
See application file for complete search history.

(56) References Cited

U.S. PATENT DOCUMENTS

| | | | | |
|---|---|---|---|---|
| 6,518,097 | B1* | 2/2003 | Yim | H01L 21/6836 257/E21.508 |
| 2001/0018276 | A1* | 8/2001 | Suzuki | H01L 21/67115 438/800 |
| 2006/0105544 | A1* | 5/2006 | Takanashi | C09D 5/32 438/460 |
| 2014/0137435 | A1* | 5/2014 | Yano | A43B 1/10 36/83 |

FOREIGN PATENT DOCUMENTS

JP         2006-140311         6/2006

* cited by examiner

*Primary Examiner* — Syed Gheyas
(74) *Attorney, Agent, or Firm* — Greer Burns & Crain, Ltd.

(57) ABSTRACT

There is provided a laser processing method of laser-processing a wafer along a plurality of streets formed in a lattice manner on a top surface of the wafer, the wafer having devices formed in a plurality of regions partitioned by the streets, the laser processing method including: a wafer holding step of holding an undersurface of the wafer by a chuck table; a resin supplying step of supplying a water-soluble liquid resin to the top surface of the wafer; a protective film forming step of forming a protective film P on the wafer as a result of drying the water-soluble liquid resin by irradiating the water-soluble liquid resin with light from a xenon flash lamp; a laser irradiating step of irradiating the wafer with a laser beam through the protective film along the streets; and a cleaning step of cleaning the wafer after the laser irradiating step.

8 Claims, 8 Drawing Sheets

LASER PROCESSING METHOD

BACKGROUND OF THE INVENTION

Field of the Invention

The present invention relates to a laser processing method of dividing a wafer into a plurality of device chips by irradiating the wafer with a laser beam.

Description of the Related Art

Generally, in manufacturing devices, a plurality of chip regions are partitioned by a plurality of streets (planned dividing lines) arranged in a lattice manner on a top surface of a wafer, and devices such as ICs (Integrated Circuits), LSIs (Large Scale Integrations), or the like are formed in these chip regions. Used for dividing these devices is laser processing that forms grooves in the top surface of the wafer by applying a laser beam along the streets of the wafer.

In this kind of laser processing, when the laser beam is applied, minute dust referred to as debris is produced and scattered, and is then deposited on the top surfaces of the devices, consequently decreasing the quality of the devices. A processing method has therefore been proposed which coats the top surface of the wafer with a protective film in advance, then performs laser processing, and cleans and removes debris adhering to the protective film together with the protective film (see Japanese Patent Laid-Open No. 2006-140311, for example). In this kind of processing method, after a liquid resin that is to constitute the protective film is supplied to the top surface of the wafer, the resin is dried by rotating the wafer in a circumferential direction, so that the predetermined protective film is formed.

SUMMARY OF THE INVENTION

When the top surface of the wafer on which the protective film is formed is irradiated with a laser beam, the plasma of an element constituting the wafer is excited in the vicinity of the top surface of the wafer. When the plasma is excited, the protective film is exposed to the plasma. Thus, in a case where the protective film has a small thickness, the wafer may be plasma-etched, and thereby the wafer may be damaged. It is therefore desirable to form the protective film so as to have a thickness capable of resisting the plasma.

However, the conventional drying by rotating the wafer in the circumferential direction takes a long time to form the protective film to a predetermined thickness, and thus results in poor productivity. In addition, with the conventional method, it is difficult to sufficiently dry the protective film to the inside thereof. In a case of a wafer having bumps (metal electrodes) on the top surfaces of devices, in particular, the protective film needs to be formed to a sufficient thickness to cover up to upper portions of the bumps. The thickness of the protective film is therefore inevitably increased, so that the drying takes a longer time.

It is accordingly an object of the present invention to provide a laser processing method that can efficiently dry a resin for forming a protective film.

In accordance with an aspect of the present invention, there is provided a laser processing method of laser-processing a wafer along a plurality of streets formed in a lattice manner on a top surface of the wafer, the wafer having devices formed in a plurality of regions partitioned by the streets, the laser processing method including: a wafer holding step of holding an undersurface of the wafer by a chuck table; a resin supplying step of supplying a water-soluble liquid resin to the top surface of the wafer; a protective film forming step of forming a protective film on the top surface of the wafer as a result of drying the water-soluble liquid resin by irradiating the water-soluble liquid resin with light from a xenon flash lamp; a laser irradiating step of irradiating the wafer with a laser beam through the protective film along the streets; and a cleaning step of cleaning the wafer after the laser irradiating step.

The light applied from the xenon flash lamp is desirably pulsed light. In addition, the pulsed light is applied at a light emission frequency of 3 Hz to 100 Hz, and energy per pulse is desirably 10 J to 1000 J (joules).

According to the present invention, a protective film having a sufficient thickness to be capable of resisting the laser processing can be formed by efficiently drying the liquid resin supplied to the top surface of the wafer. Therefore, damage to the wafer by the laser processing can be suppressed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A laser processing method according to an embodiment of the present invention will be described. Contents described in the following embodiment do not limit the present invention. In addition, constituent elements described in the following include constituent elements easily conceivable by those skilled in the art and substantially identical constituent elements. Further, constitutions described in the following can be combined as appropriate. In addition, constitutions can be omitted, replaced, or changed in various manners without departing from the spirit of the present invention.

Figure 1:
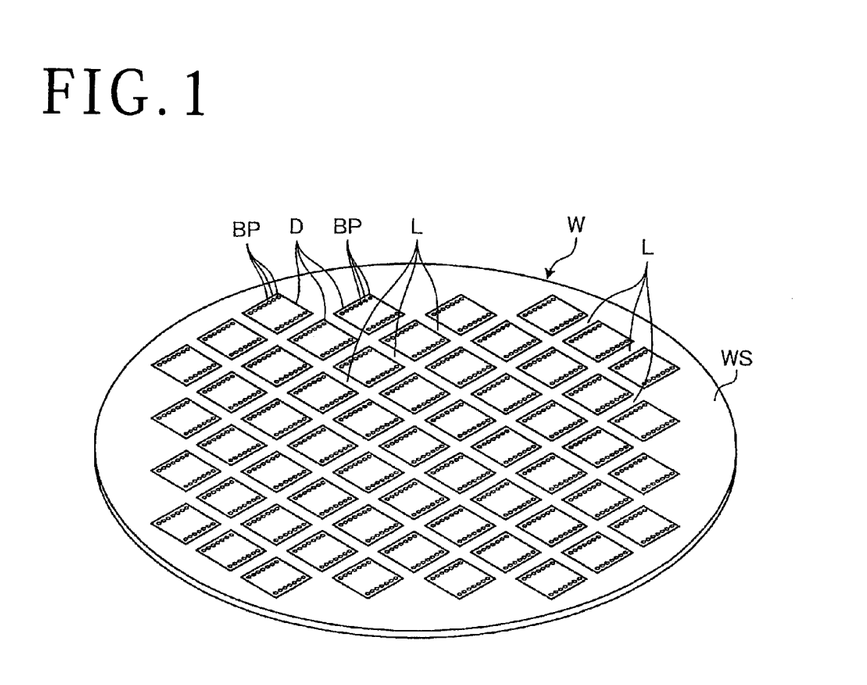
FIG. 1 is a perspective view of a wafer as a processing object for a laser processing method according to a present embodiment.
Figure 2:
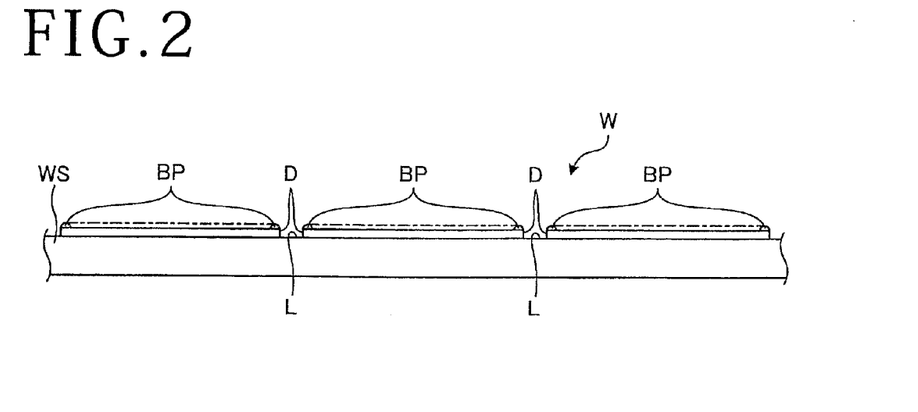
FIG. 2 is a side view of principal parts of the wafer illustrated in FIG. 1.

FIG. 1 is a perspective view of a wafer as a processing object for the laser processing method according to the present embodiment. FIG. 2 is a side view of principal parts of the wafer illustrated in FIG. 1. As illustrated in FIG. 1, the wafer (workpiece) W is a semiconductor wafer or an optical device wafer having a disk-shaped substrate WS. The substrate WS of the wafer W is formed by using, for example, silicon, sapphire, gallium, or the like. As illustrated in FIG. 1 and FIG. 2, the wafer W has a plurality of streets (planned processing lines) L formed in a lattice manner on the top surface of the wafer W, and a device D is formed in each of regions partitioned by the plurality of streets L. In addition, the device D on the wafer W has a plurality of bumps BP (electrodes) each formed so as to project from the top surface of the device D. These bumps BP are formed by, for example, a noble metal such as gold (Au), platinum (Pt), or the like or an alloy of Sn—Cu or the like. Incidentally, the number, position, and size of the bumps BP formed on each device D are not limited to the number, the position, and the size illustrated in FIG. 1. The number, position, and size of the bumps BP can be changed as appropriate as long as the bumps BP are arranged so as to be exposed on the top surface of the device D.

Figure 3:
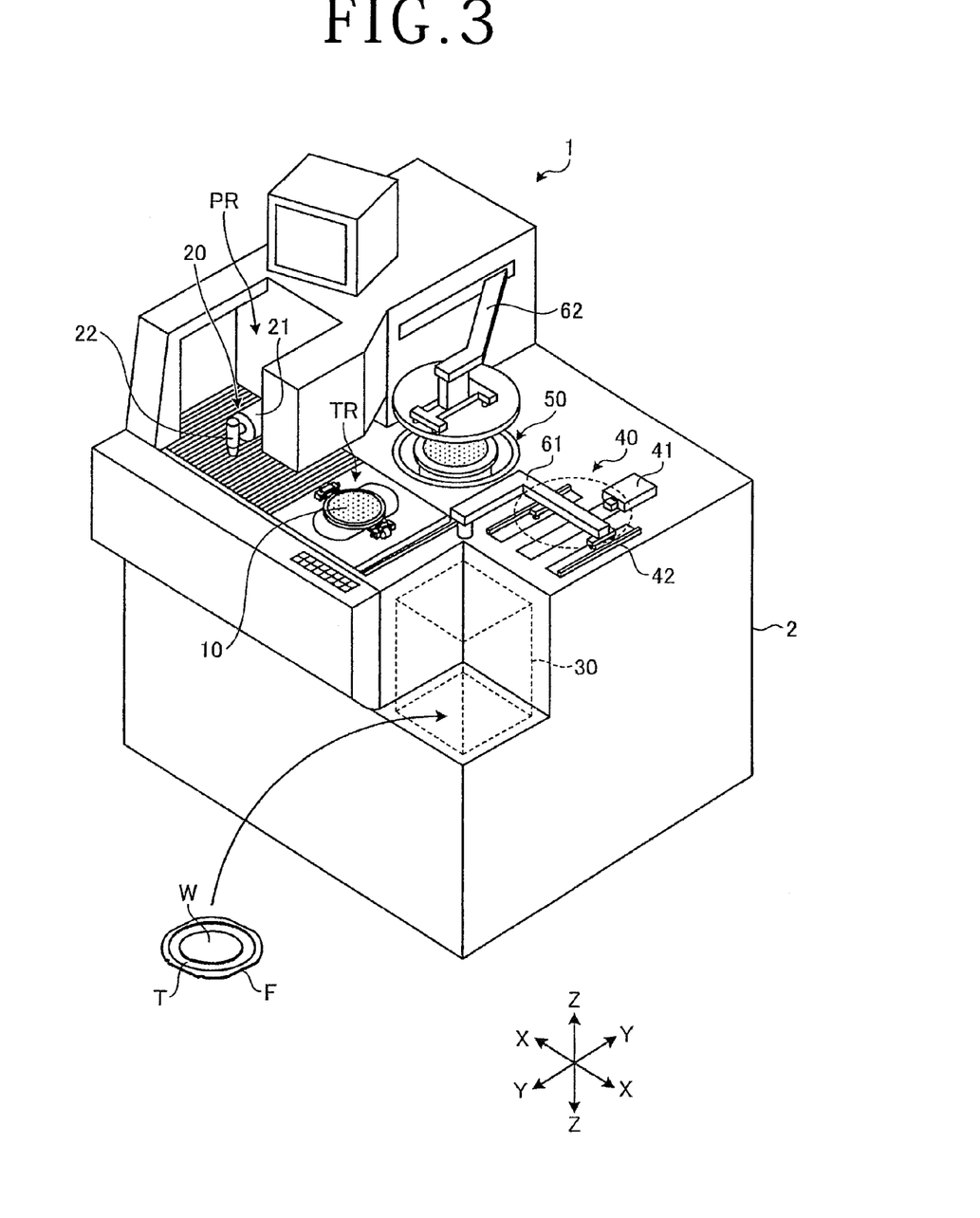
FIG. 3 is a perspective view illustrating an example of constitution of a laser processing apparatus.

FIG. 3 is a perspective view illustrating an example of constitution of a laser processing apparatus used by the laser processing method according to the present embodiment. It is to be noted that the laser processing apparatus 1 is not limited to the configuration example illustrated in FIG. 3. The laser processing apparatus 1 forms a water-soluble protective film on the top surface of the wafer W, and forms laser-processed grooves by applying a laser beam along the streets L of the wafer W (the forming of the laser-processed grooves is referred to as laser processing). Then, after the laser processing, the protective film is removed from the top surface of the wafer W.

As illustrated in FIG. 3, the laser processing apparatus 1 includes a chuck table 10 and a laser beam irradiating unit 20. The laser processing apparatus 1 further includes: a cassette elevator (not illustrated) mounted with a cassette 30 housing wafers W before and after the laser processing; a temporary placing unit 40 for temporarily mounting a wafer W before and after the laser processing; and a protective film forming and cleaning unit 50 that forms a protective film on the wafer W before the laser processing, and removes the protective film from the wafer W after the laser processing. The laser processing apparatus 1 further includes: X-axis moving means not illustrated in the figures which means moves the chuck table 10 and the laser beam irradiating unit 20 relative to each other in an X-axis direction; Y-axis moving means not illustrated in the figures which means moves the chuck table 10 and the laser beam irradiating unit 20 relative to each other in a Y-axis direction; and Z-axis moving means not illustrated in the figures which means moves the chuck table 10 and the laser beam irradiating unit 20 relative to each other in a Z-axis direction.

The chuck table 10 holds the wafer W when the wafer W on which the protective film is formed is subjected to the laser processing. A part constituting the top surface of the chuck table 10 has the shape of a disk formed of porous ceramic or the like. The chuck table 10 is connected to a vacuum suction source not illustrated in the figures via a vacuum suction path not illustrated in the figures. The chuck table 10 holds the wafer W by sucking the wafer W mounted on the top surface of the chuck table 10. The chuck table 10 is provided so as to be movable by the X-axis moving means in the X-axis direction over a carrying in/out region TR in the vicinity of the cassette 30 and a processing region PR in the vicinity of the laser beam irradiating unit 20, and is provided so as to be movable in the Y-axis direction by the Y-axis moving means.

The laser beam irradiating unit 20 is provided to the processing region PR provided on an apparatus main body 2, and forms a laser-processed groove by irradiating the top surface of the wafer W held on the chuck table 10 with a laser beam. The laser beam has a wavelength absorbable by the wafer W. The laser beam irradiating unit 20 is provided so as to be movable by the Z-axis moving means in the Z-axis direction with respect to the wafer W held on the chuck table 10. The laser beam irradiating unit 20 includes an oscillator 21 that oscillates the laser beam and a condenser 22 that condenses the laser beam oscillated by the oscillator 21. The frequency of the laser beam oscillated by the oscillator 21 is adjusted as appropriate according to the kind of the wafer W, a processing mode, and the like. For example, a YAG laser oscillator, a YVO4 laser oscillator, or the like can be used as the oscillator 21. The condenser 22 includes a total reflection mirror that changes the traveling direction of the laser beam oscillated by the oscillator 21, a condensing lens that condenses the laser beam, and the like.

The cassette 30 houses a plurality of wafers W each stuck to an annular frame F via an adhesive tape T. The cassette elevator is provided to the apparatus main body 2 of the laser processing apparatus 1 so as to be raised and lowered freely in the Z-axis direction. The temporary placing unit 40 takes out one wafer W before the laser processing from the cassette 30, and stores the wafer W after the laser processing within the cassette 30. The temporary placing unit 40 includes: carrying in/out means 41 for taking out the wafer W before the laser processing from the cassette 30 and inserting the wafer W after the laser processing into the cassette 30; and a pair of rails 42 on which the wafer W before and after the laser processing is temporarily mounted.

The wafer W before the laser processing on the pair of rails 42 is transferred to the protective film forming and cleaning unit 50 by first transfer means 61. The protective film forming and cleaning unit 50 forms a protective film on the wafer W before the laser processing. In addition, the wafer W after the laser processing is transferred to the protective film forming and cleaning unit 50 by second transfer means 62. The protective film forming and cleaning unit 50 removes the protective film on the wafer W after the laser processing. The first and second transfer means 61 and 62 are each, for example, configured to be able to suck the top surface of the wafer W and lift the wafer W. The first and second transfer means 61 and 62 each lift the wafer W, and transfer the wafer W to a desired position.

Figure 4:
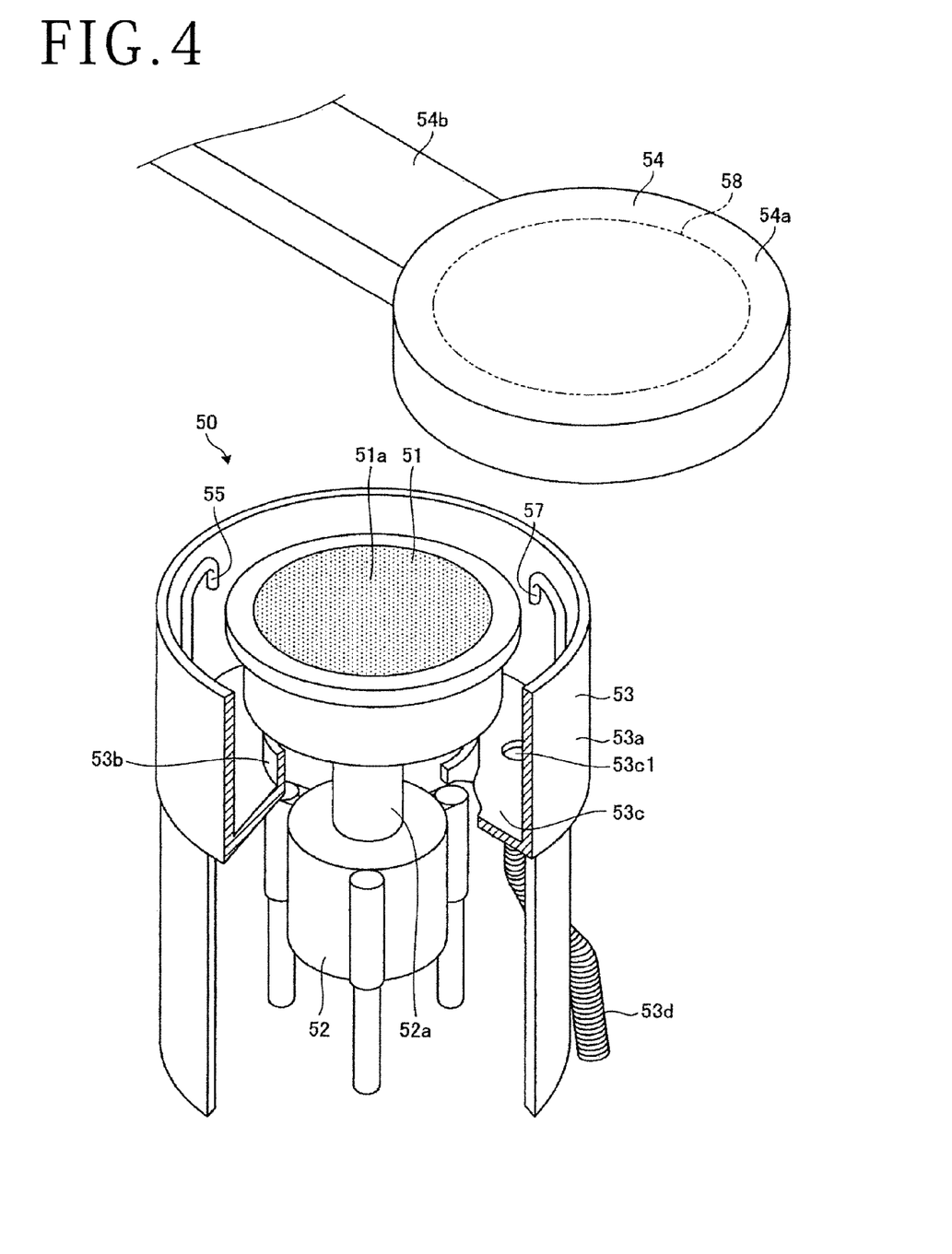
FIG. 4 is a perspective view illustrating an example of constitution of a protective film forming and cleaning unit of the laser processing apparatus.

As illustrated in FIG. 4, the protective film forming and cleaning unit 50 includes: a spinner table 51 that retains the wafer W before and after the laser processing; an electric motor 52 that rotates the spinner table 51 about an axis parallel with the Z-axis direction (see FIG. 3); and a water receiving portion 53 disposed on the periphery of the spinner table 51. The spinner table 51 is formed in the shape of a disk. The spinner table 51 includes a suction chuck 51a formed of porous ceramic or the like in a central portion of the top surface (upper surface) of the spinner table 51. The suction chuck 51a is made to communicate with suction means not illustrated in the figure. Thus, the spinner table 51 holds the wafer W by sucking the wafer W mounted on the suction chuck 51a.

An upper end of a driving shaft 52a of the electric motor 52 is coupled to the spinner table 51, so that the electric motor 52 rotatably supports the spinner table 51. The water receiving portion 53 is formed annularly, including an outer wall 53a and an inner wall 53b that are in a cylindrical shape and a bottom wall 53c that couples the outer wall 53a and the inner wall 53b to each other. The water receiving portion 53 receives excess amounts of liquid resin supplied to the top surface of the wafer W when a protective film is formed on the top surface, cleaning water supplied to the top surface when the protective film on the top surface is cleaned and removed, and the like. A drainage port 53c1 is provided in the bottom wall 53c. A drain hose 53d is connected to the drainage port 53c1.

The protective film forming and cleaning unit 50 also includes: a resin liquid supply nozzle 55 that supplies the wafer W held on the spinner table 51 with a water-soluble liquid resin that is to constitute the protective film; and a cleaning water nozzle 57 that supplies the wafer W after the laser processing on the spinner table 51 with cleaning water. The nozzles 55 and 57 are each configured to be movable to an operating position at which a nozzle opening is located above the center of the spinner table 51 and a retracted position at which the nozzle opening is off the spinner table 51. The resin liquid supply nozzle 55 is connected to a liquid resin supply source, which is not illustrated in the figure. The resin liquid supply nozzle 55 is thus able to supply the water-soluble liquid resin to the top surface of the wafer W. A water-soluble resin material such as PVA (polyvinyl alcohol), PEG (polyethylene glycol), PVP (polyvinylpyrrolidone), or the like is used as the liquid resin. These liquid resins are solidified by drying to form, on the top surface of the wafer W, a protective film that protects the top surface. The cleaning water nozzle 57 is connected to a cleaning water (for example, pure water) supply source not illustrated in the figure.

The protective film forming and cleaning unit 50 also includes a drying light source unit 54 for drying the liquid resin supplied to the wafer W on the spinner table 51, the drying light source unit 54 being disposed so as to face the spinner table 51. The drying light source unit 54 includes a light source main body 54a and a supporting portion 54b supporting the light source main body 54a. The supporting portion 54b, for example, supports the light source main body 54a in such a manner as to be movable, within a range not interfering with the second transfer means 62 described above, to an operating position at which the light source main body 54a is located above the spinner table 51 and a retracted position at which the light source main body 54a is off the spinner table 51.

The light source main body 54a, for example, has a shape such that a peripheral wall extends downward from a peripheral edge of a circular plate, and is internally provided with xenon flash lamps 58 (see FIG. 6) as operation lamps. The light source main body 54a is formed of such a size as to have substantially the same outside diameter as the outside diameter of the water receiving portion 53. The internally arranged xenon flash lamps 58 are arranged so as to include the whole of the spinner table 51 in an irradiation region. The xenon flash lamps 58 are, for example, a light source emitting pulsed light having a wavelength of 200 nm to 1000 nm, and include an oscillator not illustrated in the figure which oscillator oscillates the pulsed light. In the present embodiment, the xenon flash lamps 58 apply pulsed light having a light emission frequency of 3 Hz to 100 Hz. Energy per pulse of the pulsed light is 10 J to 1000 J (joules).

The protective film covering the top surface of the wafer W is formed by drying the liquid resin. The protective film is originally intended to prevent debris produced during the laser processing from adhering to the top surface of the wafer W. However, the protective film may be exposed to plasma excited during the laser processing, and the wafer W may be plasma-etched, so that the wafer W may be damaged. Therefore, the protective film is desired to be formed with a thickness capable of resisting plasma. However, conventional drying by merely rotating the wafer W in a circumferential direction takes a long time to form a protective film to a predetermined thickness, and thus results in poor productivity. In the case of the wafer W having the bumps BP on the top surfaces of the devices D, in particular, the protective film needs to be formed to a sufficient thickness to cover up to upper portions of the bumps BP, and therefore the thickness of the protective film is inevitably increased, so that the drying takes a longer time.

The laser processing method according to the present embodiment is characterized by forming a protective film having a sufficient thickness to be capable of resisting the laser processing in a short time by efficiently drying the liquid resin supplied to the top surface of the wafer W. The laser processing method will next be described.

Figure 5:
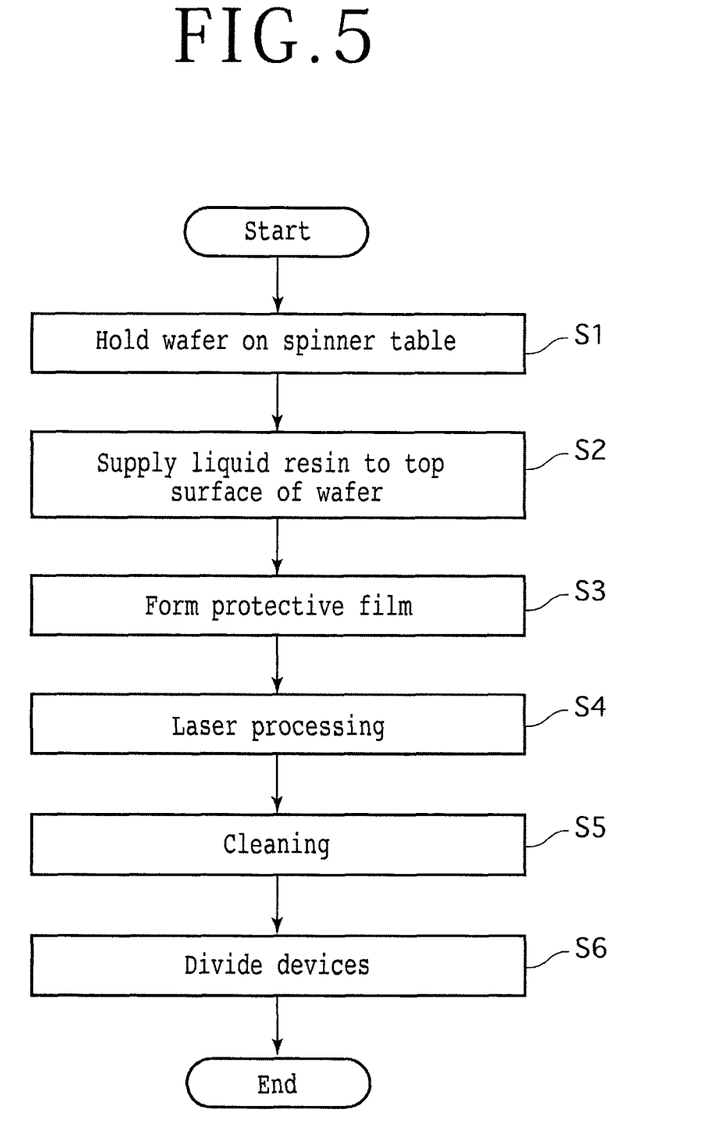
FIG. 5 is a flowchart illustrating a procedure of the laser processing method according to the present embodiment.

FIG. 5 is a flowchart illustrating a procedure of the laser processing method according to the present embodiment. As a first step of the processing procedure, the undersurface of an unprocessed wafer W is held on the spinner table 51 (step S1: a wafer holding step). Specifically, one wafer W before the laser processing which wafer W is housed in the cassette 30 of the laser processing apparatus 1 is taken out from the cassette 30 using the carrying in/out means 41, and the wafer W is mounted on the pair of rails 42. The wafer W mounted on the pair of rails 42 is transferred to the spinner table 51 of the protective film forming and cleaning unit 50 by the first transfer means 61. The spinner table 51 holds the wafer W by sucking the wafer W mounted on the suction chuck 5a.

Figure 6:
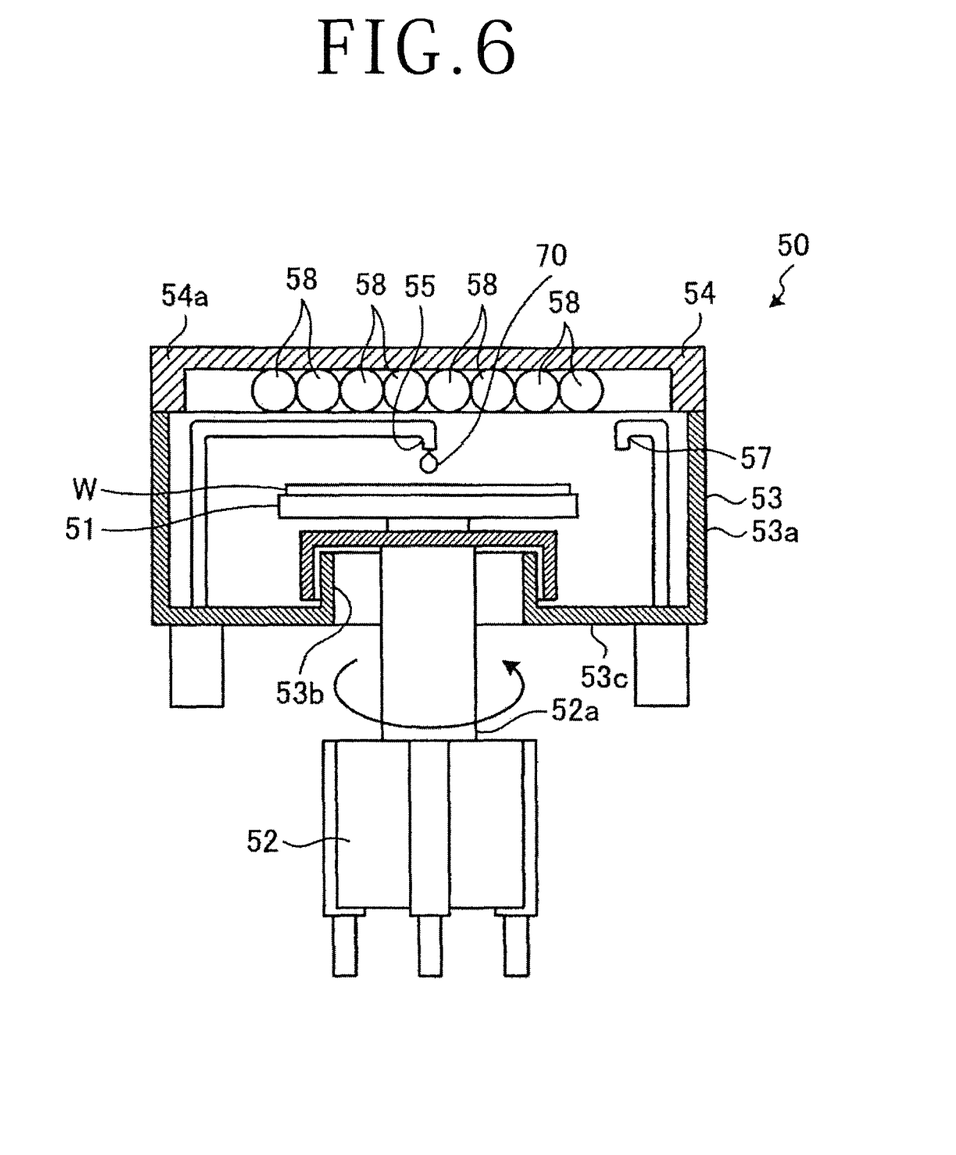
FIG. 6 is a sectional view illustrating a water-soluble liquid resin supplying step.

Next, a liquid resin is supplied to the top surface of the wafer W (step S2: a supplying step). Specifically, as illustrated in FIG. 6, the resin liquid supply nozzle 55 is placed above the wafer W, and a water-soluble liquid resin (for example, PVA (polyvinyl alcohol)) 70 is supplied from the resin liquid supply nozzle 55 to the wafer W in a state in which the spinner table 51 is rotated at a predetermined rotational speed. In this case, the supply port of the resin liquid supply nozzle 55 is desirably located on the axis of rotation of the spinner table 51. According to this, the supplied liquid resin 70 is spread from the center of the wafer W to the outside in a radial direction by a centrifugal force attendant on the rotation of the spinner table 51. Thus, the liquid resin 70 on the wafer W can be adjusted to a uniform thickness.

Figure 7:
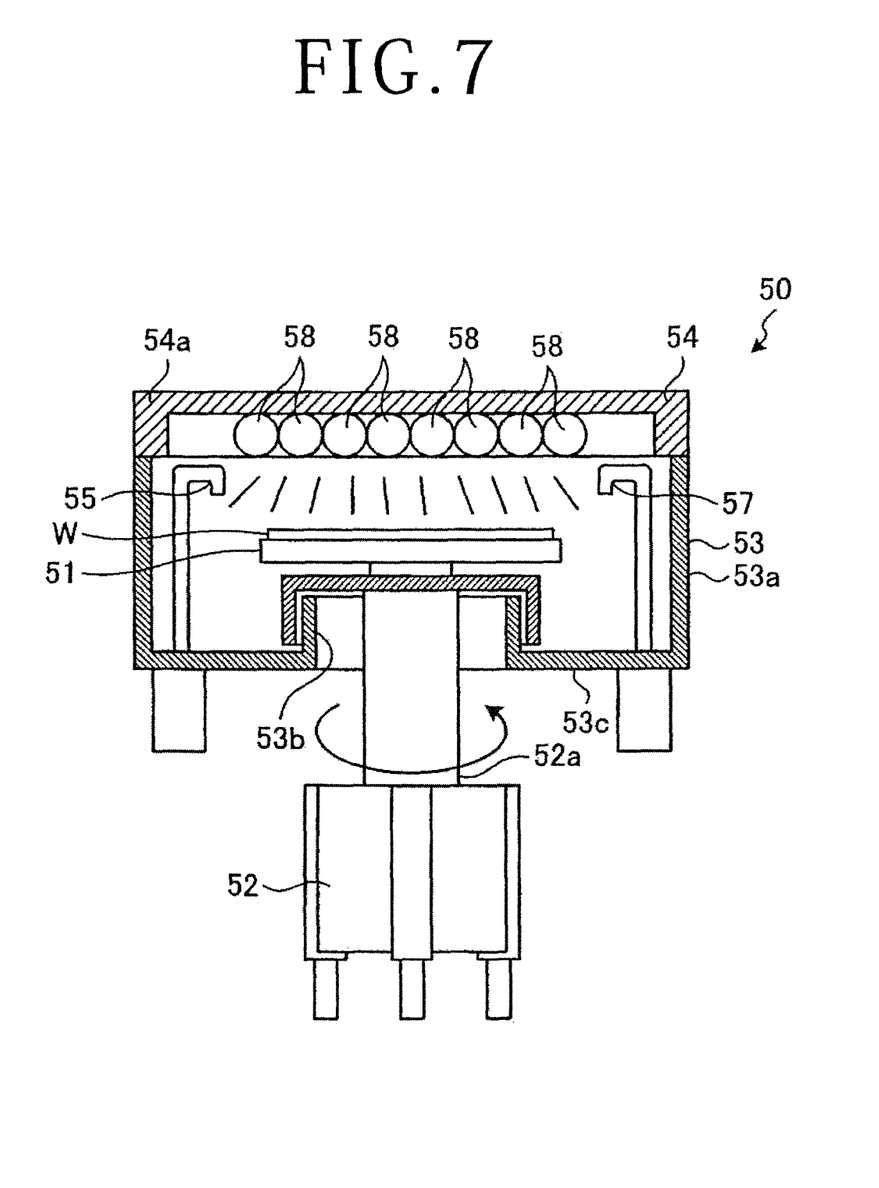
FIG. 7 is a sectional view illustrating a protective film forming step of forming a protective film by drying a supplied liquid resin.
Figure 8:
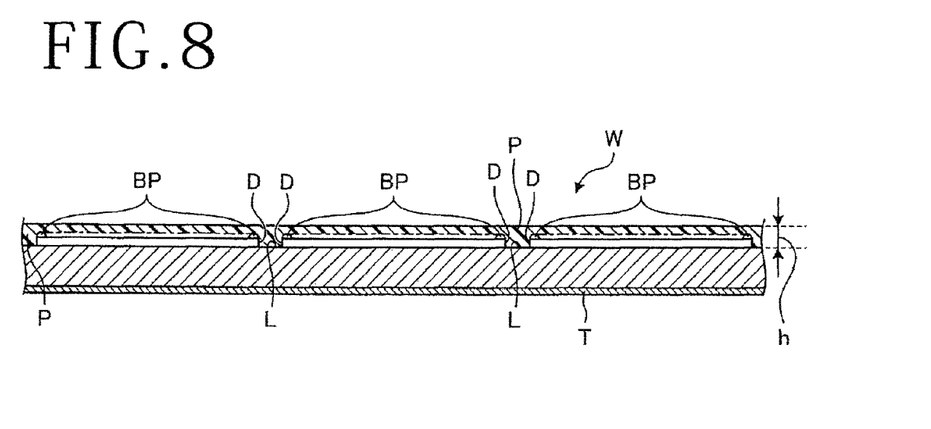
FIG. 8 is a sectional view of principal parts of the wafer on which the protective film is formed.

Next, a protective film is formed by drying the liquid resin 70 on the top surface of the wafer W (step S3). Specifically, as illustrated in FIG. 7, the light source main body 54a of the drying light source unit 54 in which the xenon flash lamps 58 are arranged is positioned over the spinner table 51 holding the wafer W, and the xenon flash lamps 58 are lit in this state. In the present embodiment, the xenon flash lamps 58 apply pulsed light of 10 to 150 pulses/second, and energy per pulse of the pulsed light is set to be 10 J to 15 J (joules). Consequently, the liquid resin 70 on the wafer W is dried (solidified) by being irradiated with the pulsed light of the xenon flash lamps 58, and as illustrated in FIG. 8, a protective film P having a desired film thickness h (for example, 20 μm) is formed on the top surface of the wafer W.

Figure 9:
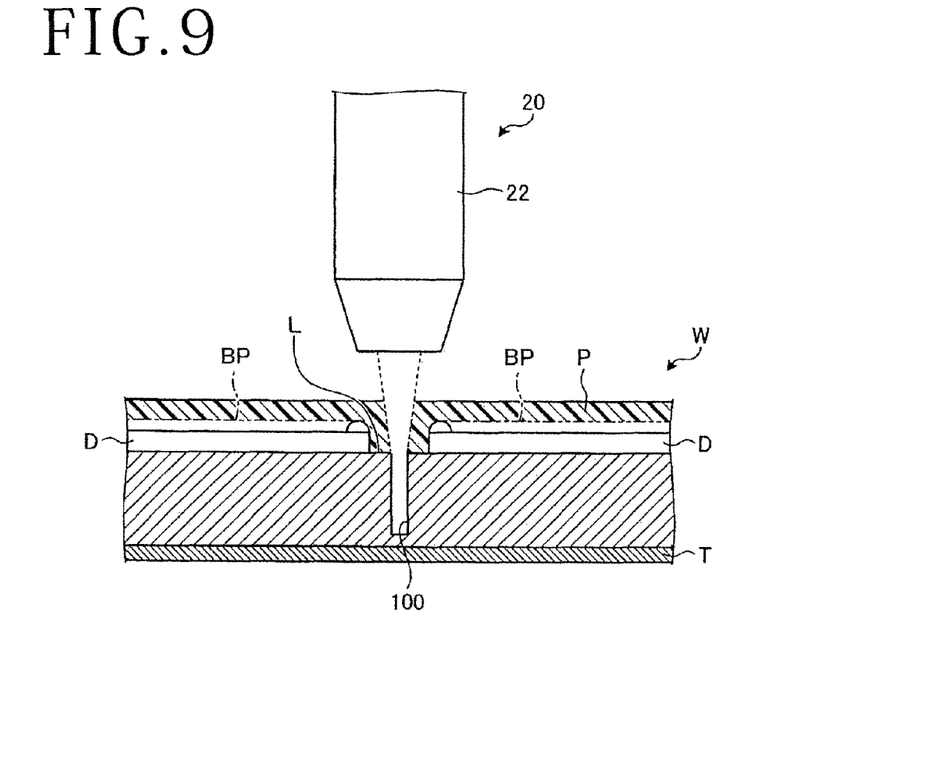
FIG. 9 is a sectional view illustrating a laser beam irradiating step.

Next, laser processing is performed (step S4: a laser beam irradiating step). In this case, the light source main body 54a of the drying light source unit 54 is retracted from above the spinner table 51 holding the wafer W, and the second transfer means 62 transfers the wafer W onto the chuck table 10 from the position on the spinner table 51 of the protective film forming and cleaning unit 50. The chuck table 10 holds the wafer W mounted on the top surface of the chuck table 10 by sucking the wafer W. The laser beam irradiating unit 20 then applies a laser beam from the condenser 22 through the protective film P of the wafer W to a predetermined street L. Here, while the laser beam is applied, the chuck table 10 is moved in the X-axis direction or the Y-axis direction by the X-axis moving means or the Y-axis moving means at a predetermined feed speed (for example, 100 mm/second). Consequently, as illustrated in FIG. 9, a laser-processed groove 100 is formed along the predetermined street L by ablation processing. In this case, the protective film P having the desired film thickness h is formed on the top surface of the wafer W. It is therefore possible to suppress damage to the wafer W by the laser processing.

Figure 10:
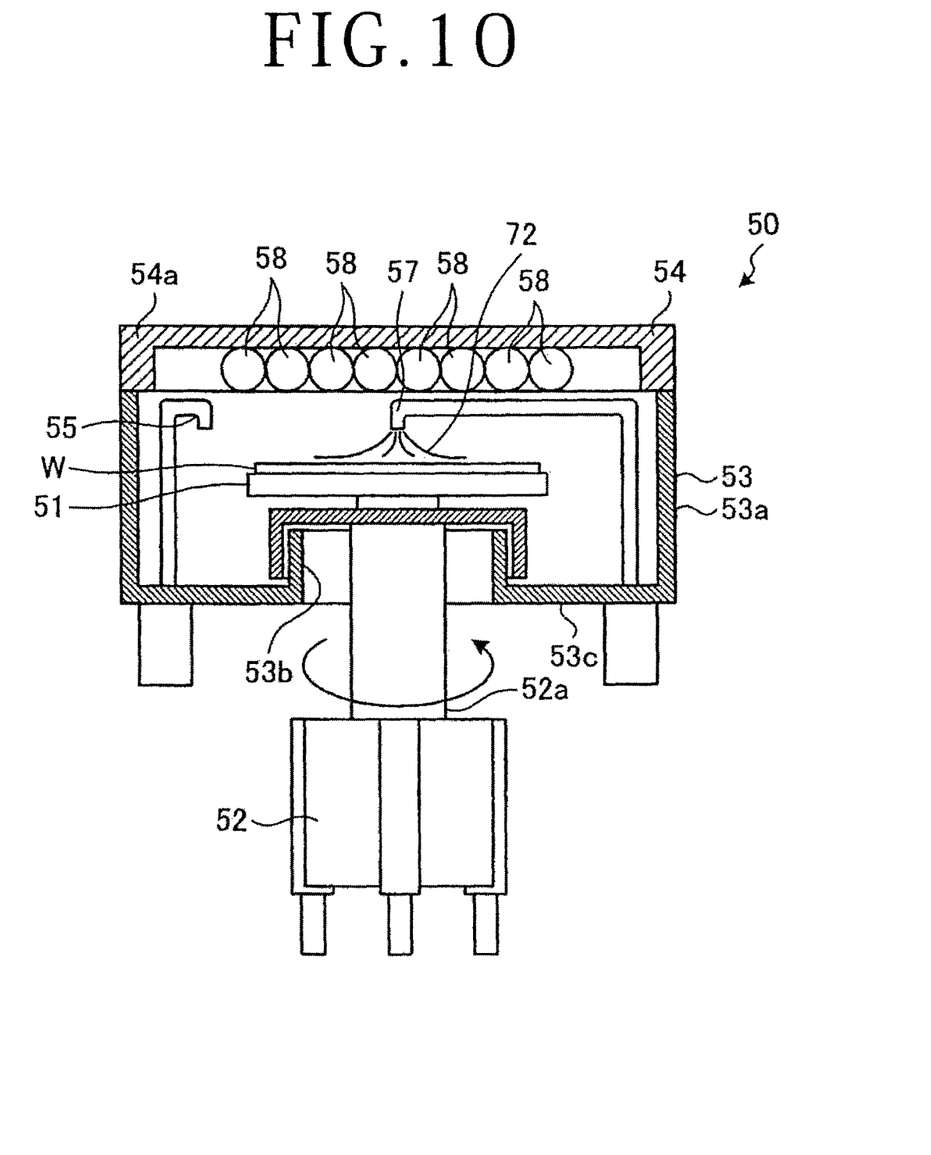
FIG. 10 is a sectional view illustrating a cleaning step of cleaning the wafer.

Next, the protective film is removed by cleaning (step S5: a cleaning step). In this case, the second transfer means 62 transfers the wafer W after the laser processing from the position on the chuck table 10 onto the spinner table 51 of the protective film forming and cleaning unit 50 again. The wafer W is then held on the suction chuck 51a of the spinner table 51. As illustrated in FIG. 10, cleaning water 72 is supplied to the wafer W from the cleaning water nozzle 57 in a state in which the cleaning water nozzle 57 is placed above the wafer W and the spinner table 51 is rotated at a predetermined rotational speed. The protective film P (FIG. 8) is formed by drying the water-soluble liquid resin 70. Thus, when the cleaning water 72 is supplied to the protective film P, the protective film P dissolves in the cleaning water 72, and is removed from the top surface of the wafer W. In this case, debris produced by the laser processing is removed from the top surface of the wafer W together with the protective film P. Finally, devices D are divided along the laser-processed grooves 100 (step S6). The processing is then ended.

According to the present embodiment, there is provided a laser processing method of laser-processing a wafer W along a plurality of streets L formed in a lattice manner on a top surface of the wafer W, the wafer W having devices D formed in a plurality of regions partitioned by the streets L, the laser processing method including: a wafer holding step (step S1) of holding an undersurface of the wafer W; a supplying step (step S2) of supplying a water-soluble liquid resin 70 to the top surface of the wafer W; a protective film forming step (step S3) of forming a protective film P on the wafer W as a result of drying the water-soluble liquid resin 70 by irradiating the water-soluble liquid resin 70 with light from a xenon flash lamp 58; a laser irradiating step (step S4) of irradiating the wafer W with a laser beam through the protective film P along the streets L; and a cleaning step (step S5) of cleaning the wafer W after the laser irradiating step. Thus, the protective film P having a sufficient film thickness h to be capable of resisting the laser processing can be formed as a result of drying the liquid resin 70 on the top surface of the wafer W efficiently by irradiating the liquid resin 70 with the pulsed light of the xenon flash lamp 58. It is therefore possible to suppress damage to the wafer W and an adhesive tape T by the laser processing.

As an example, according to an experiment of the inventors, when the liquid resin 70 was dried (solidified) by using the xenon flash lamp 58 described above, the protective film P having the desired film thickness h described above was formed in two to three minutes. On the other hand, drying (solidification) by merely rotating the wafer W in a circumferential direction took 30 minutes to form the protective film P having the desired film thickness h described above. Thus, the protective film P having the desired film thickness h can be formed efficiently in a shorter time than conventional.

In addition, the inventors used a halogen lamp heater (peak wavelength: 900 nm to 1600 nm) and a quartz heater (peak wavelength: 1500 nm to 5600 nm) as other light sources. In this case, however, it is necessary to perform irradiation with a higher power to dry the protective film P having the desired film thickness h to the inside thereof. As a result, the protective film P was damaged due to an increase in amount of heat generation, and the adhesive tape T retaining the wafer W and an annular frame F melted, so that the protective film P having the desired film thickness h was not formed efficiently in a short time.

In addition, according to the present embodiment, the xenon flash lamp 58 applies pulsed light of 10 to 150 pulses/second, and energy per pulse of the pulsed light is 10 J to 15 J (joules). Thus, the protective film P having the desired film thickness h can be formed in a short time.

One embodiment of the present invention has been described above. The present embodiment is presented as an example, and is not intended to limit the scope of the invention. The present embodiment can be carried out in various other forms, and various omissions, substitutions, changes can be made without departing from the spirit of the invention. The present embodiment and modifications thereof are included in the scope and spirit of the invention, and are similarly included in the invention described in claims and equivalent scope thereof.

In the present embodiment, the xenon flash lamps 58 are arranged so as to be able to irradiate the entire top surface of the wafer W simultaneously. However, for example, a linear xenon flash lamp is set in a line shape extending in a radial direction from the center of the wafer W when the xenon flash lamp can irradiate the entire top surface of the wafer W. In this case, the wafer W is rotated in a circumferential direction while pulsed light is applied from the xenon flash lamp in the line shape. Therefore, the entire surface of the wafer W can be irradiated with the pulsed light. In this case, a low cost can be achieved by the miniaturization of the xenon flash lamp.

In addition, in the present embodiment, a wafer having bumps BP on devices D has been described as the wafer W. However, the present invention can be applied also to wafers W without bumps BP.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing method of laser-processing a wafer along a plurality of streets formed in a lattice manner on a top surface of the wafer, the wafer having devices formed in a plurality of regions partitioned by the streets, the laser processing method comprising:
   a wafer holding step of holding an undersurface of the wafer by a chuck table;
   a resin supplying step of supplying a water-soluble liquid resin to the top surface of the wafer;
   a protective film forming step of forming a protective film on the top surface of the wafer as a result of drying the water-soluble liquid resin by irradiating the water-soluble liquid resin with light from a single xenon flash lamp, wherein the single xenon flash lamp is generally linearly-shaped and is positioned above the wafer with a first end of the single xenon flash lamp being provided approximately above the center of the wafer and extending radially outwardly to a second end in the radial direction of the wafer;

a rotation step of rotating the wafer while pulsed light is applied from the single xenon flash lamp such that the entire surface of the wafer can be irradiated by the single xenon flash lamp;

a laser irradiating step of irradiating the wafer with a laser beam through the protective film along the streets; and a cleaning step of cleaning the wafer after the laser irradiating step.

2. The laser processing method according to claim 1, wherein the pulsed light is applied at a light emission frequency of 3 Hz to 100 Hz, and energy per pulse is 10 J to 1000 J.

3. The laser processing method according to claim 1, wherein the thickness of the protective film formed as a result of the protective film forming step is 20 μm.

4. A laser processing method of laser-processing a wafer along a plurality of streets formed in a lattice manner on a top surface of the wafer, the wafer having devices formed in a plurality of regions partitioned by the streets, the laser processing method comprising:

a wafer holding step of holding an undersurface of the wafer by a chuck table provided within a protective film forming and cleaning unit, wherein the protective film forming and cleaning unit includes a water receiving portion that surrounds the chuck table;

a resin supplying step of supplying a water-soluble liquid resin to the top surface of the wafer;

a protective film forming step of forming a protective film on the top surface of the wafer as a result of drying the water-soluble liquid resin by irradiating the water-soluble liquid resin with light from a xenon flash lamp, wherein the xenon flash lamp is supported by a light source main body, and further wherein the light source main body has a shape that corresponds to the shape of the water receiving portion;

a laser irradiating step of irradiating the wafer with a laser beam through the protective film along the streets; and a cleaning step of cleaning the wafer after the laser irradiating step.

5. The laser processing method according to claim 4, wherein:

the water receiving portion is generally cylindrical and includes an outer wall that defines an outer diameter; and the light source main body includes a peripheral wall having substantially the same outer diameter as the outer diameter of the outer wall of the water receiving portion.

6. The laser processing method according to claim 4, wherein the light is pulsed light.

7. The laser processing method according to claim 6, wherein the pulsed light is applied at a light emission frequency of 3 Hz to 100 Hz, and energy per pulse is 10 J to 1000 J.

8. The laser processing method according to claim 4, wherein the thickness of the protective film formed as a result of the protective film forming step is 20 μm.

* * * * *